United States Patent [19]

Brown et al.

[11] Patent Number: 5,333,153

[45] Date of Patent: Jul. 26, 1994

[54] SIGNAL QUALITY DETECTION METHOD AND APPARATUS FOR OPTIMUM AUDIO MUTING

[75] Inventors: David L. Brown, Miami; Paul D. Marko, Ft. Lauderdale; Jaime A. Borras, Hialeah, all of Fla.

[73] Assignee: Motorola, Inc., Schaumburg, Ill.

[21] Appl. No.: 823,521

[22] Filed: Jan. 21, 1992

[51] Int. Cl.⁵ .............................................. H04B 1/10
[52] U.S. Cl. ................................... 375/104; 455/218; 455/222; 455/223; 375/99
[58] Field of Search ................ 375/104; 455/218, 221, 455/222, 223, 220

[56] References Cited

U.S. PATENT DOCUMENTS

| 3,939,431 | 2/1976 | Cohlman | 455/221 |
| 3,984,776 | 10/1976 | Stedman | 455/226.3 |
| 4,344,175 | 8/1982 | Leslie | 455/218 X |
| 4,411,021 | 10/1983 | Yoakum | 455/222 |
| 4,455,664 | 6/1984 | Burke | 455/218 X |
| 4,613,974 | 9/1986 | Vokac et al. | 375/121 X |
| 4,891,824 | 1/1990 | Takamura et al. | 375/104 |

Primary Examiner—Stephen Chin
Assistant Examiner—Bryan Webster
Attorney, Agent, or Firm—Pablo Meles

[57] ABSTRACT

A digital communication device (10) comprises a signal quality detector (18) that determines the quality of the received signals and instantaneously mutes and unmutes the voice output (22) of the digital radio communication device when the quality drops below a selected level to prevent noise bursts from being heard by the user of the communication device.

3 Claims, 5 Drawing Sheets

SIGNAL QUALITY DETECTION METHOD AND APPARATUS FOR OPTIMUM AUDIO MUTING

TECHNICAL FIELD

This invention relates generally to digital communication equipment, and more specifically to digital radio telephone communication.

BACKGROUND

In today's digital communications devices, which carry digitized voice (such as second generation cordless telephone or CT2), it is important to realize the situations that can occur during a communication session. When a communication link has been established and two parties are at opposite ends of the communications link, a reliable communication path must be maintained. If the communication path fails, the units should be capable of muting the digitized voice, thus preventing the end users from hearing high noise bursts from corrupted receive data. In current systems there are very few ways to obtain this function, and the ways that are present are very slow to respond, or easily falsed.

In addition, in digital communication systems using time-division multiplexing, synchronization is required so that a communication unit receiving information signals "knows" at what times the information is to be received. Once synchronization is achieved, the communication signals received are subject to deterioration for a variety of possible reasons. Among these are loss of the transmission at the other end of the communication link, interference on the same or an adjacent channel and fading of the received signal due to increasing distance between the transmitting and receiving units. When a "bad" signal (or portion of a signal) is received the user of the receiving unit may hear annoying pops or bursts, or may even lose the communication link. Thus, a need exists for an communication device that overcomes the aforementioned problems.

SUMMARY OF THE INVENTION

Briefly, according to the invention, a digital communication device comprises a signal quality detector that determines the quality of the received signals and instantaneously mutes and unmutes the voice output of the digital radio communication device when the quality drops below a selected level to prevent noise bursts from being heard by the user of the communication device.

DETAILED DESCRIPTION OF THE PREFERRED EMBODIMENT

Figure 1:
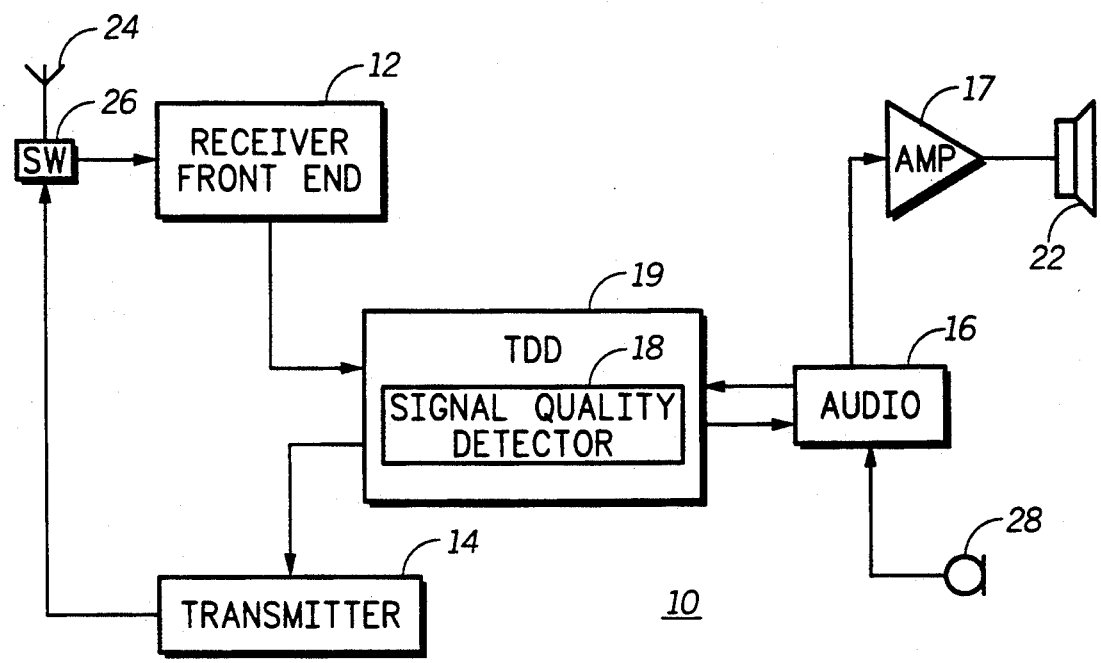
FIG. 1 is a simplified block diagram of a radio telephone circuit including a signal quality detector in accordance with the invention.

Referring to FIG. 1, there is shown a simplified block diagram of a radio telephone handset 10 having a signal quality detector 18 in accordance with the invention. The handset 10 is preferably a CT2 handset which comprises a receiver front end 12, an audio section 16, (including an amplifier 17 and voice output 22) and a transmitter section 14 for transmitting signals that include voice received at a microphone 28. CT2 communication systems operate in accordance with a document entitled "MPT1375 Common Air Interface Specification" (CAI) which establishes a time-division multiplexed protocol having alternating one millisecond receive and transmit frames separated by guard time segments. In one multiplexing scheme each transmit/receive segment includes a B channel (64 bits) and a D channel which contains 1 or 2 bits at each end of the B channel.

An antenna switch 26 is for alternately switching the transmitter 14 and the receiver 12 to an antenna 24, in accordance with an established protocol. A time division multiplexer (TDD) 19 is coupled to the receiver front end 12, to the transmitter 14, and to the audio section 16 for providing time-division multiplexing and receive/transmit framing of the digital signals. The audio section 16 is used to control audio from the microphone 28 and from the receiver front end.

The signal quality detector 18 is coupled to (and is preferably a part of) the TDD 19, and to the receiver front end 12 so that it can sample received digital signals to determine their quality. When the signal quality detector 18 determines that a predetermined portion of a received digital signal is not acceptable, it sends an audio "mute" signal to the audio section 16, causing the audio to mute instantaneously. This prevents the "bad" signal portion from being presented to a user of the handset 10, and consequently avoids the resulting noise burst problems.

Figure 2:
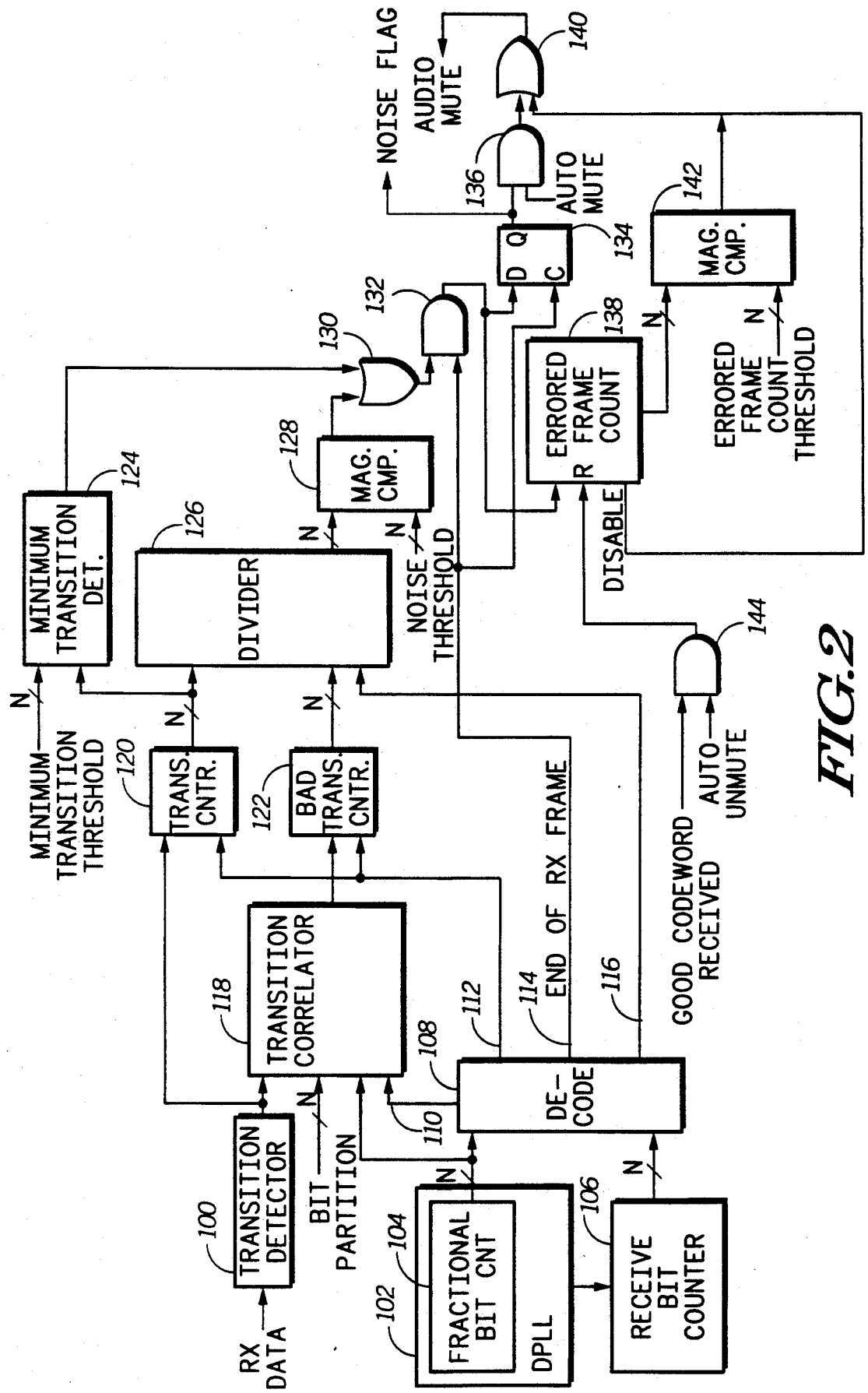
FIG. 2 is a block diagram of a signal quality detector in accordance with the invention.

Referring to FIG. 2, there is shown a block diagram of signal quality detector circuitry in accordance with the invention. The signal quality detection circuits 18 determine the quality of the incoming received data based on the number of incoming transitions and where the transitions fall within each bit time.

Figure 3:
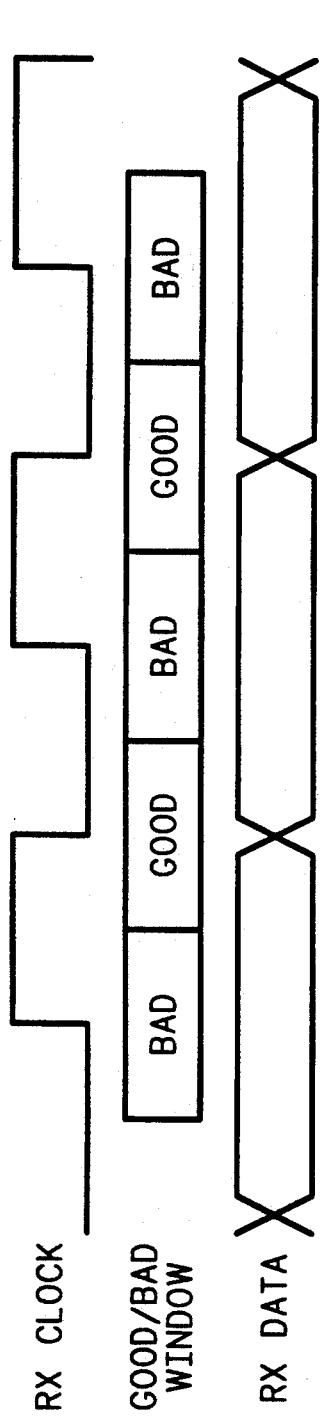
FIG. 3 shows the relationship between the good/bad window and receive clock.

Referring to FIG. 3 there is shown the relationship between a "good/bad" window and a receive clock. The top signal is the receive clock signal. The middle signal represents a series of sampling periods referred to as "good" and "bad" windows. The bottom signal represents the received data signals. Digital signals comprise a plurality of data pulses (representing bits of information). There are two types of transitions in digital signals: low-to-high and high-to-low. In TDD systems a receiving communication unit must "know" when to expect the received data. Thus, these transitions must occur at times that the receiving unit is "expecting" them (i.e., during the "good windows"). If transitions occur at other times (i.e., during the "bad windows") they are considered "bad" transitions. In order to maintain a desired quality of audio output, the audio output is muted instantaneously when a certain ratio of bad transitions to total transitions is reached or exceeded.

Referring again to FIG. 2, the circuit 18 operates by partitioning each received bit into good and bad windows as to where a transition can fall. During the beginning of each receive frame, the transition counter 120 and bad transition counter 122 are cleared. When a transition occurs, the transition counter 120 is incremented by 1 and if the transition falls within the bad transition window, the bad transition counter 122 is also incremented by 1. The only exception to this rule is when multiple transitions fall within a good window. In this case, the transition counter 120 will only be incremented by 1 and the bad transition 122 counter will also be incremented by 1. More than one transitions within the same good window are considered a bad transition.

A digital phase-locked loop (DPLL) 102 includes a fractional bit counter 104 which samples each received bit 32 times (i.e., it counts from 0 to 31) to maintain alignment to the incoming bit stream. The fractional bit counter 104 has an N-bit output bus that is coupled to a decoder 108 to indicate equally spaced 1/32 bit intervals within each bit. This information is used to identify the phase relationship of incoming RX data transitions to those expected by the DPLL recovered clock. At this point the DPLL 102 is operating in a narrow bandwidth.

A Minimum Transition Detector 124 includes a Minimum Transition Threshold setting. This setting provides for selection of the minimum number of transitions allowed in a 2 millisecond receive frame of information before it is deemed in error. The Minimum Transition Detector 124 also receives a count of the total transitions detected by counter 120. This count is compared with the minimum transition threshold. The output of the Minimum Transition Detector 124 is coupled to an OR gate 130. When the number of total transitions is below the Minimum Transition Threshold, a logic one is applied to OR gate 130.

Receive (RX) data is received at a transition detector 100. The transition detector 100 is a bistable circuit that monitors the RX data for low-high and high-low transitions. When a transition occurs, a flag (i.e., a bit indicating that a transition has occurred in the RX data) is set at the output of the transition detector 100, and a transition counter 120 is incremented.

Receive bit counter 106 is a synchronous counter that functions to determine when to receive data (i.e., to open a "receive" window). This counter is aligned at link initiation and is clocked by the DPLL recovered clock. The receive bit counter 106 also has an N-bit output bus that is coupled to the decoder 108.

The decoder 108 decodes the outputs of blocks 104 and 106, and provides four outputs, 110, 112, 114, and 116. Output 110 enables transition correlator 118 when an RX frame is received. Output 112 enables (total) transition counter 120 and bad transition counter 122 for each Rx frame. Output 114 is an End-of-Frame indicator which enables Gate 132 at the end of a RX frame. Output 116 enables the divider 126 for each RX frame.

The transition correlator 118 has an N-bit Bit Partition setting. This setting allows software to control the boundaries of what is deemed a good transition, and what is deemed a bad transition. It operates based on 32 samples per bit. Therefore, if this setting is 8, the good boundaries or window would be ±8 samples or ±¼ of the bit. This would leave the bad boundaries or window at +¼ to +¾ of a bit.

The transition correlator 118 compares the output of the fractional bit counter 104 with the Bit Partition setting. If the output of transition detector 100 flags a transition within a bad window, the output of the transition correlator 118 indicates a "bad" transition, and both a transition counter 120 and a bad transition counter 122 are incremented.

Thus, at the end of the received frame, the transition counter 120 is tested to determine if its count is below the minimum transition threshold. A Divider 126 divides the bad transition count by by the total transition count and applies the resulting quotient to a magnitude comparator 128 where the resulting quotient is tested to determine if it is above a selected noise threshold. If either of these cases are true, then the received frame is in error.

The magnitude comparator 128 includes a Noise Threshold (Maximum Phase Error) setting. This setting allows programming of the percentage of noise allowed before the received frame is deemed to be in error. This number may be programmable in increments of 1/255.

Thus, the ratio of bad/total transitions is compared with the selected noise threshold level in magnitude comparator 128. If the bad/total ratio exceeds the selected noise threshold level, an error message (i.e., a logic one) is applied to OR gate 130.

AND gate 132 only allows the error message to go through to flip-flop 134 at the end of a RX frame because error signal is only required after the preceding results are calculated. Flip-flop 134 sets a "noise" flag when the error message is received and voice will be instantaneously muted. The output of flip-flop 134 is coupled to an AND gate 136. AND gate 136 has an Auto Mute setting. This setting allows software to control muting of the voice on a 2 millisecond basis. If the incoming frame is deemed to be in error, voice will be instantaneously muted.

Thus, when the AND gate 136 provides an error message to an OR gate 140 which applies a mute signal to the audio portion 16 of the communication device 10, causing its audio output to be muted.

In addition to muting when a predetermined bad/total transition ratio is reached, it may be desirable to unmute after a certain time interval, such as when a good codeword (i.e., a CT2 data packet) is received. In the CAI, during voice transmission codewords are exchanged at regular intervals in the D channel. These are detected in the receive frame by separate data decoder circuitry within the TDD 19.

An AND gate 44 has two inputs: (1) a Good Codeword Received input, and (2) an Auto Unmute input. The Auto Unmute input allows software to control how voice is unmuted. If set to one and a good codeword (packet of data) is received, gate 144 provides a reset signal to an Errored Frame Counter 138, causing its count to return to 0, and the voice to be unmuted. This is accomplished by means of a Magnitude Comparator 142, which includes an "Errored Frame Count Threshold" setting. This setting provides for software control of the number of received frames in error since the last good codeword (good data packet) was received before continuous muting occurs. If this value is set to zero, this feature is disabled.

The errored frame count is incremented by the output of AND gate 132, and its output is tested against the errored frame count threshold. If the errored frame count threshold is met, then continuous muting occurs until a good codeword has been received if the auto unmute input is true.

If a good codeword (a packet of data) has been received, the errored frame counter 138 is cleared and voice is allowed to begin until the errored frame count meets its threshold again.

The audio mute output is used to force zeroes to the speech coding mechanism (such as an Adaptive Differential Pulse Code Modulation transcoder).

Figure 4:
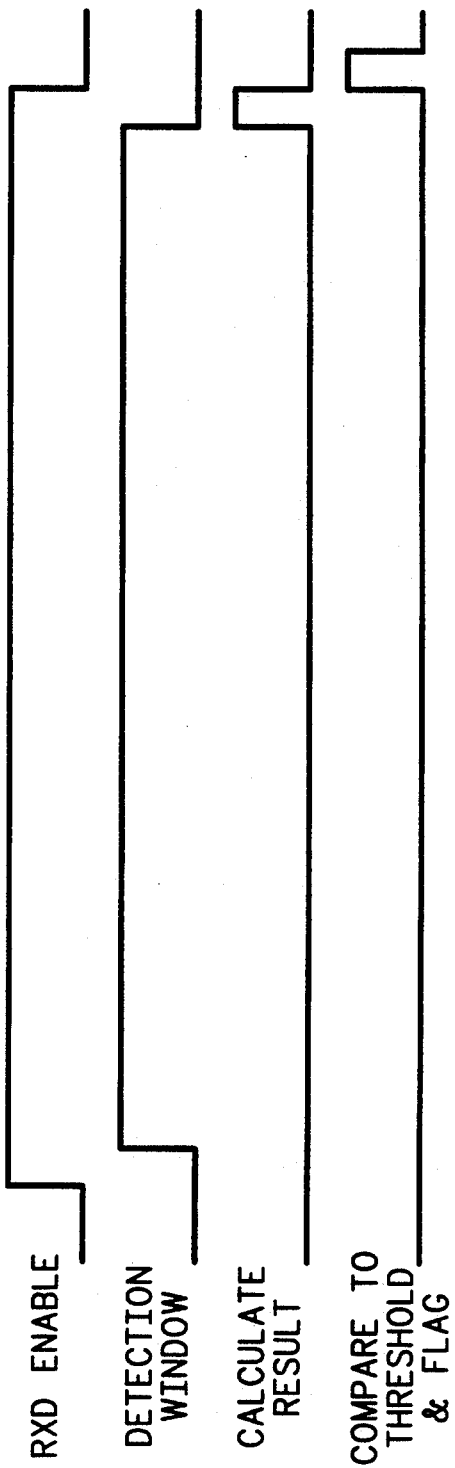
FIG. 4 shows a signal quality detection window in relation to other signals.

Referring to FIG. 4, them is shown a signal quality detection window in relation to other signals. The RDX Enable signal is provided by the output 110 of decoder 108. The "Calculate Result" pulse is provided at output 116 after the end of the detection window. The "Compare to Threshold and Flag" pulse is provided at output 114 when a received frame ends.

Figure 5:
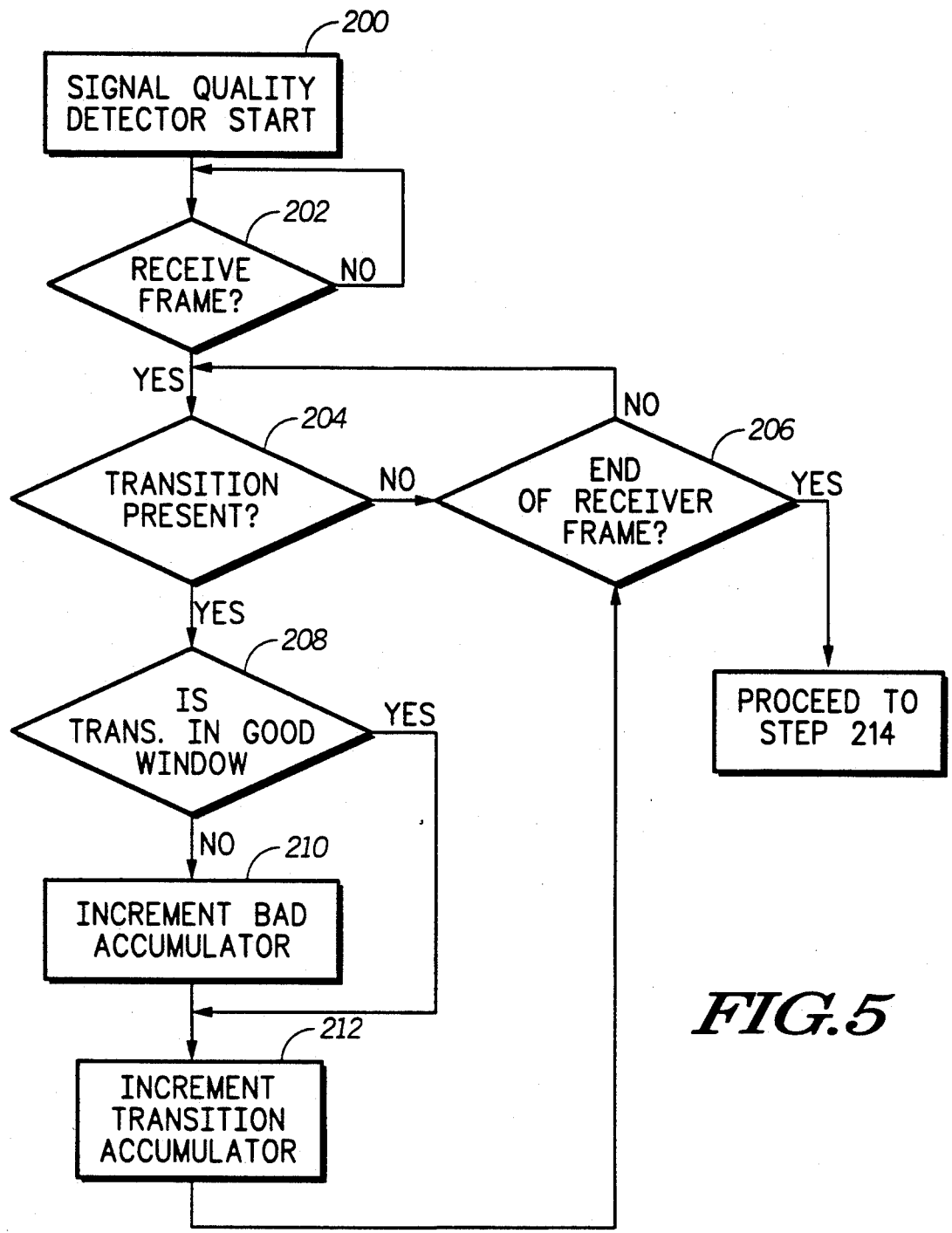
FIGS. 5 and 6 show a flow chart of an audio muting method in accordance with the invention.

Referring to FIG. 5, there is shown an audio muting process, in accordance with the invention, for use in a CT2 communication system. In step 200 the signal quality detector begins its process. In decision 202 it is determined whether a receive frame is received. If decision 202 is affirmative, decision 204 determines whether a transition is present. If decision 202 is negative, decision 202 is made again.

If decision 204 is affirmative, a further decision 208 is made to determine whether the transition has occurred during a good window. If decision 208 is affirmative, only the transition counter (or accumulator) 120 is incremented (210). If the decision 208 is negative, the Bad transition accumulator 122 and the transition accumulator 120 are incremented (210 and 212).

Following step 212 or when decision 204 is negative, a decision 206 is made to determine whether the end of the receive frame has been reached. If decision 206 is negative the process returns to decision 204. If decision 206 is affirmative, the process proceeds to step 214 (see FIG. 6).

Figure 6:
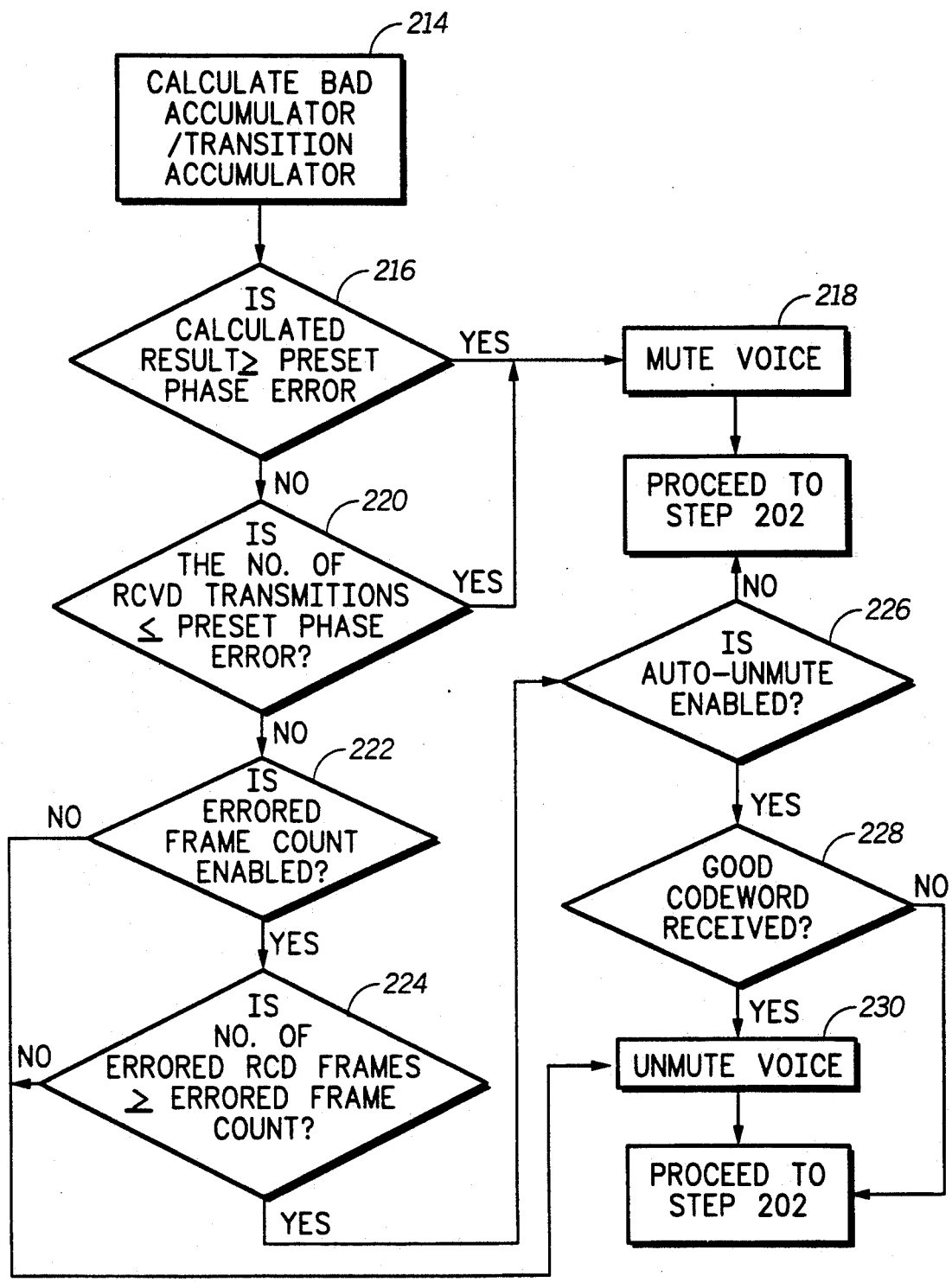

Referring to FIG. 6, the process of FIG. 5 continues at step 214. In step 214 the bad transition count is divided by the total transition count. A decision 216 is then made to determine whether the result of the above division is equal to or greater than a preset phase error level. If decision 216 is affirmative, the voice output of the communication device is muted (218), and the process continues at step 202. If decision 216 is negative, a further decision 220 is made to determine whether the count of receive transitions is less than or equal to the preset phase error level (noise threshold). If decision 220 is affirmative, the voice output of the communication device is muted (218), and the process continues at step 202.

If decision 220 is negative, another decision 222 is made to determine whether the errored frame counter is enabled. If decision 222 is affirmative, a further decision 224 is made to determine whether the number of errored receive frames is greater than or equal to the errored frame count. If either decision 222 or 224 is negative, the voice output is unmuted (230), and the process continues at step 202.

If decision 224 is affirmative, a further decision 226 is made to determine whether auto-unmute is enabled. If decision 226 is negative, the voice output is unmuted (230), and the process continues at step 202. If decision 226 is affirmative, a decision 228 is made to determine whether a good codeword has been received. If decision 228 is negative, the process continues at step 202. If decision 228 is affirmative, the voice output is unmuted (230), and the process continues at step 202.

The above described method and apparatus has been explained by reference to a CT2 handset, but it will be understood that the principles of the invention are equally applicable to a CT2 base station, or any digital communication system. Therefore, the foregoing method and apparatus avoids noise burst problems by muting of a radio-receiver audio in response to monitoring of received signal quality in accordance with the invention.

What is claimed is:

1. A radio communication device comprising:

receiver means for receiving radio signals when a communication link is established with another radio communication device, the radio signals comprising digital information;

an audio section for producing output audio signals representing the radio signals received by the radio receiver;

signal quality detection means for sampling the radio signals received at the receiver means to determine a number of transitions in the digital information that occur at predetermined times, wherein the signal quality detection means comprises means for determining whether a good data packet has been received and means for unmuting the audio section when a good data packet is received, a good data packet being a data packet in which at least a predetermined number of transitions in the received data occur during predetermined intervals; and muting means for muting the audio section when the number of transitions in the digital information that occur at the predetermined times exceeds a predetermined threshold.

2. A radio communication device comprising:

receiver means for receiving radio signals when a communication link is established with another radio communication device, the radio signals comprising digital information;

an audio section for producing output audio signals representing the radio signals received by the radio receiver;

signal quality detection means for sampling the radio signals received at the receiver means, the signal quality detection means comprising:

first counter means for counting the number of transitions in the digital information that occur during a predetermined receive interval;

second counter means for counting the number of transitions in the digital information that occur during a set of predetermined subintervals occurring during parts of the receive interval, divider means for dividing the number of transitions in the digital information that occur during the predetermined receive interval by the number of transitions in the digital information that occur during a set of predetermined subintervals, to produce a transition quotient;

muting means for muting the audio section when the transition quotient exceeds a predetermined threshold;

means for determining whether a good data packet has been received; and means for unmuting the audio section when a good data packet is received, a good data packet being a data packet in which at least a predetermined number of transitions in the received data occur during predetermined intervals.

3. A process for muting the audio output of a communication device for receiving received digital data, the process comprising the steps of:

(a) determining whether a receive frame is received;

(b) determining whether a transition in the received data is present in the receive frame;

(c) determining whether a transition in the received data is present in a first predetermined time interval occurring during part of the receive frame;

(d) incrementing a first counter when the determination of step (b) is affirmative;

(e) incrementing a second counter when the determination of step (c) is affirmative;
(f) determining a first count for the first counter and a second count for the second counter after a predetermined number of set time intervals;
(g) dividing the second count by the first count to produce a transition quotient;
(h) comparing the transition quotient with a selected threshold;
(i) muting the audio output of the communication device when the transition quotient exceeds the selected threshold;
(j) determining whether a good data packet has been received; and
(k) unmuting the audio section when a good data packet is received, a good data packet being a data packet in which at least a predetermined number of transitions in the received data occur during predetermined intervals.

* * * * *